(12) United States Patent
Bell

(10) Patent No.: US 7,664,150 B2
(45) Date of Patent: Feb. 16, 2010

(54) DIODE LASER ELECTRICAL ISOLATION SYSTEM

(75) Inventor: Jacob Lee Bell, Vancouver, WA (US)

(73) Assignee: nLight Photonics Corporation, Vancouver, WA (US)

( * ) Notice: Subject to any disclaimer, the term of this patent is extended or adjusted under 35 U.S.C. 154(b) by 118 days.

(21) Appl. No.: 11/338,329

(22) Filed: Jan. 24, 2006

(65) Prior Publication Data

US 2007/0171947 A1 Jul. 26, 2007

(51) Int. Cl.
*H01S 3/00* (2006.01)
(52) U.S. Cl. ............... 372/38.1; 372/38.02; 372/38.07; 372/29.015
(58) Field of Classification Search ............... 372/38.1, 372/38.02
See application file for complete search history.

(56) References Cited

U.S. PATENT DOCUMENTS 5,134,623 A * 7/1992 Egawa et al. .................. 372/31
5,930,015 A * 7/1999 Yamamoto et al. ............ 398/71
6,028,878 A 2/2000 Agarwal et al.
7,269,192 B2 * 9/2007 Hayashi ........................ 372/34
2002/0150139 A1 * 10/2002 Koshimae et al. ............. 372/75

FOREIGN PATENT DOCUMENTS

JP 09048152 * 2/1997

* cited by examiner

*Primary Examiner*—Dung T Nguyen
(74) *Attorney, Agent, or Firm*—Patent Law Office of David G. Beck

(57) ABSTRACT

A system is provided that electrically isolates a diode laser when the health of the diode laser deteriorates past a preset value. In addition to the diode laser and its power supply, the system includes a monitoring system that monitors the voltage across the diode laser and/or the voltage across a series resistor and/or the operating temperature of the diode laser and/or one or more characteristics of the output beam of the diode laser and/or the temperature of the diode laser coolant and/or the flow rate of the diode laser coolant. The system also includes a power supply controller and associated control circuit that is activated upon receipt of a trigger signal from the monitoring system.

10 Claims, 2 Drawing Sheets

US 7,664,150 B2

DIODE LASER ELECTRICAL ISOLATION SYSTEM

FIELD OF THE INVENTION

The present invention relates generally to diode lasers and, more particularly, to a method and apparatus for electrically isolating a diode laser.

BACKGROUND OF THE INVENTION

High power diode lasers, typically utilizing bar and stacked array configurations, are capable of reliably producing in excess of hundreds of watts. In order to achieve these power levels, high drive currents are required. Unfortunately as a result of these drive currents, the failure of an individual diode laser can often lead to the catastrophic failure of an entire diode laser bar or array. Additionally, diode laser failure can damage other system components such as optical elements, electrical components and cooling systems that are in proximity to the defective laser.

At the end of a high power diode laser's operational life, any of a number of events may occur. For example, the diode laser can begin to de-laminate, de-bond, or simply crack. In addition to damaging adjacent diode lasers, these events can also lead to localized component melting and/or coolant leaks, the latter of which can have far reaching effects as the leaking coolant falls on other system components. Thus the failure of a single diode laser can lead to extensive system damage.

U.S. Pat. No. 6,028,878 discloses a technique which attempts to overcome one cause of diode laser failure, specifically current and voltage spikes. After noting that the current and voltage spikes (or surges) caused by power supply malfunctions and/or electrostatic forces can degrade the performance of a diode laser, the patent discloses fabricating a reverse diode laser bar along with the fabrication of the diode laser bar, the two bars sharing contact pads. As a result of this arrangement, the reverse diode laser bar provides surge protection for the corresponding diode laser bar.

Although the prior art discloses techniques for protecting a diode laser from voltage and current spikes, the prior art techniques do not provide protection to either adjacent diode lasers or system components that can be damaged when a diode laser undergoes catastrophic failure. The present invention overcomes these shortcomings.

SUMMARY OF THE INVENTION

The present invention provides a system for electrically isolating a diode laser when the health of the diode laser deteriorates past a preset value. In addition to the diode laser and its power supply, the system includes a monitoring system that monitors the voltage across the diode laser and/or the voltage across a series resistor and/or the operating temperature of the diode laser and/or one or more characteristics of the output beam of the diode laser and/or the temperature of the diode laser coolant and/or the flow rate of the diode laser coolant. The system also includes a power supply controller and associated control circuit that is activated upon receipt of a trigger signal from the monitoring system.

A further understanding of the nature and advantages of the present invention may be realized by reference to the remaining portions of the specification and the drawings.

DESCRIPTION OF THE SPECIFIC EMBODIMENTS

During the life of a high power diode laser, several events may occur that have undesirable consequences. For example, the performance of the laser may decline to such an extent that it adversely affects the overall performance of the system. In such situations it is typically useful to detect the onset of such a decline, thereby allowing the defective laser to be replaced or other measures taken. Alternately if a diode laser undergoes an open circuit failure, for example due to de-lamination or bond failure, and assuming that the diode laser in question is one of an array in which the lasers utilize a serial electrical connection, the open circuit failure can lead to the whole system losing current. Alternately if a diode laser undergoes a short circuit failure, for example due to cracking in the laser bar, adjacent lasers as well as adjacent system components may be severely damaged. Accordingly the inventor has found that by monitoring the health of the diode laser, a power supply controller can be activated when the monitored health declines past a preset point, thus avoiding costly system damage.

Figure 1:
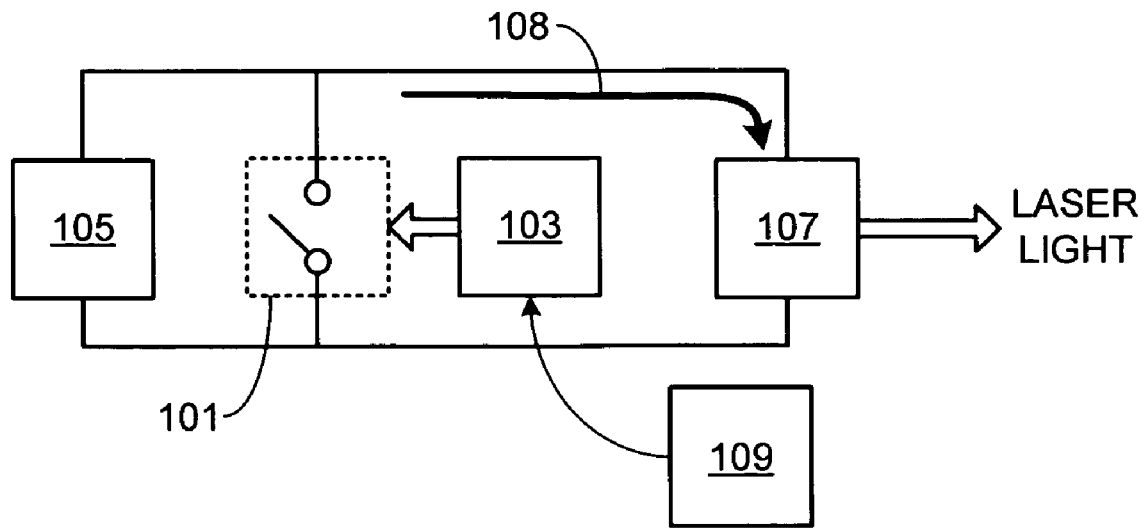
FIG. 1 is a block diagram illustrating the invention.
Figure 2:
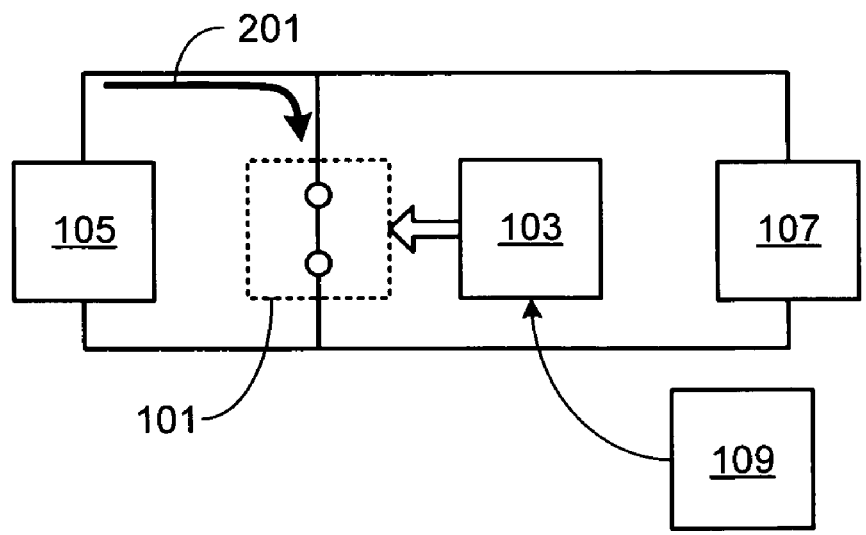
FIG. 2 is a block diagram similar to that shown in FIG. 1, except that the bypass circuit is activated.

FIGS. 1 and 2 conceptually illustrate the operation of the invention. Under typical operation as shown in FIG. 1, power supply controller 101, under the direction of control circuit 103, allows power supply 105 to provide power to diode laser 107 (i.e., current path 108). However as shown in FIG. 2, when monitoring system 109 detects that the health of diode laser 107 is failing, it directs control circuit 103 to activate power supply controller 101 (e.g., current path 201), thereby minimizing and/or eliminating further damage to diode laser 107 as well as protecting nearby system components (e.g., other lasers within a diode laser array or stack, etc.) from damage.

It will be appreciated that the phrase "power supply", as used herein, refers to any of a variety of techniques for delivering current and voltage to the diode laser. Furthermore it should be appreciated that there are a variety of ways in which monitoring system 109 can determine when the health of diode laser 107 deteriorates below a preset value. Depending upon the intended application of the invention, the preset value can be linked to optimal diode laser performance; to a level of performance necessary to achieve the desired system goals (e.g., output power for a diode laser array); as a precursor to diode laser failure; or as an indicator of actual diode laser failure.

In preferred embodiments of the invention, as described in further detail below, monitoring system 109 monitors the voltage across diode laser 107 as a means of detecting short circuit failures. Preferably in addition to monitoring the voltage across the diode laser, system 109 monitors the voltage across a resistor in series with diode laser 107, thus providing an indication of any open circuit failures.

As previously noted, the present invention is not limited to a single means of monitoring the system in order to determine when the health of the diode laser deteriorates below a preset value. For example, rather than monitoring the voltage across the diode laser and/or a series resistor, the current through the laser diode can be monitored. In an alternate approach, one or more performance characteristics of the diode laser are monitored. For example, the temperature of the diode laser can be monitored, as the diode's operating temperature will typically undergo a rapid increase during diode laser failure. Alternately, the output power, wavelength, spectral width, or polarization of the output beam can be used as an indication of the health of the diode. An advantage of monitoring the quality of the output beam is that it is easy to set performance thresholds, thus allowing the power supply controller to be activated in advance of the system's performance falling below a preset value and/or prior to actual diode laser failure. As a consequence of this approach, the possibility of any damage from the failing diode laser can be further limited.

An alternate monitoring system 109 monitors the condition of a secondary system such as the coolant system used to maintain the desired operating temperature of the diode laser. For example, monitoring system 109 can monitor the temperature of the coolant. Since the temperature of the laser diode will typically undergo a dramatic increase during/after diode failure, the temperature of the coolant can be expected to undergo an increase in temperature as well. Alternately if the coolant system is designed to vary the flow rate of the coolant depending upon the cooling demands of the diode laser, monitoring system 109 can be configured to trigger the bypass circuit if the coolant flow rate increases past a preset point.

In at least one embodiment of the invention, monitoring system 109 monitors multiple aspects of the system. In some cases this approach allows multiple failure modes to be monitored, for example detecting short circuit failures by monitoring the voltage across the laser diode and open circuit failures by monitoring the voltage across a series resistor. In other cases this approach allows system redundancy, for example by monitoring multiple aspects of the output of the laser diode (e.g., output wavelength, output wavelength stability, spectral width, polarization, output power, etc.).

Since a variety of techniques can be used by monitoring system 109 to determine the health of the laser diode as described above, it will be appreciated that monitoring system 109 can be configured to detect the performance of the diode laser falling below a preset value and/or imminent diode laser failure and/or actual diode laser failure. Once the health of the diode laser falls below the preset value, for example the onset of diode laser failure is detected as determined by monitoring system 109, a signal is sent to control circuit 103 directing the activation of power supply controller 101. It will be appreciated that although the block diagrams (i.e., FIGS. 1 and 2) show separate blocks for the control circuit and the power supply controller, elements of these two circuits can be combined into a common device. Alternately, all aspects of these two circuits can be combined into a single device.

It will be appreciated that there are a variety of ways of implementing power supply controller 101. In general, power supply controller 101 operates to change the electrical characteristics of power supply 105 and its associated circuitry to a sufficient degree to minimize and/or eliminate further damage to diode laser 107 as well as minimize potential damage to adjacent components (e.g., other diode lasers, other system components, etc.). Thus it should be understood that controller 101 can operate as a bypass circuit, an open circuit, or other means capable of adjusting the characteristics of the power supply or the circuitry coupling the power supply to the laser diode to a sufficient degree to achieve the desired results. In at least one embodiment, power supply controller 101 simply reduces the current and/or voltage supplied by power supply 105 to diode laser 107, for example using a shunting circuit or creating an open circuit with a switch. In other embodiments, power supply controller 101 changes the electrical characteristics of power supply 105 and its coupling to diode laser 107 by varying the resistive, capacitive, or inductive characteristics of the power supply circuit. In yet other embodiments, power supply controller 101 changes the output waveform and/or signal frequency of the power supply circuit.

Although in the preferred approach control circuit 103 is automated, thus insuring a rapid response to the signal sent by monitoring system 109, it should be appreciated that control circuit 103 can be manually controlled. For example, the signal sent by monitoring system 109 can be in the form of an alarm (e.g., audible alarm, warning light, etc.) which, when observed, causes the system operator to manually activate power supply controller 101. In such an approach power supply controller 101 can be a simple switch (e.g., dip switch, toggle switch, etc.), a jumper, or other means. Alternately in response to the alarm the system operator could simply turn the power supply off and repair and/or replace the malfunctioning diode laser.

Figure 3:
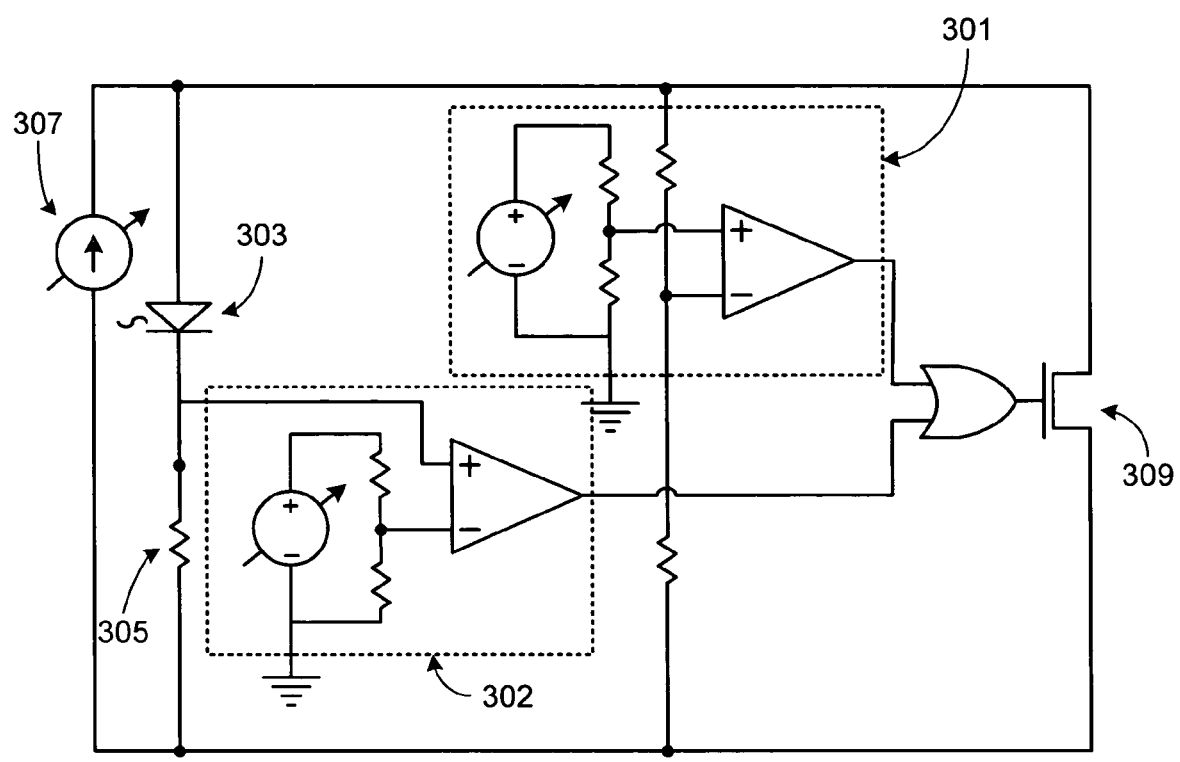
FIG. 3 is a circuit diagram of an exemplary embodiment.

FIG. 3 illustrates a specific implementation of a preferred embodiment of the invention. In this embodiment comparator circuits 301 and 302 are used to monitor the condition of diode laser 303. In particular, comparator circuit 301 monitors the voltage across diode laser 303 in order to detect short circuit failures (e.g., due to cracking in the laser bar) while comparator circuit 302 monitors the voltage across series resistor 305 in order to detect open circuit failures (e.g., due to de-lamination or bond failure). If comparator circuit 301 detects that the voltage across diode laser 303 drops below a preset value or comparator circuit 302 detects that the voltage across series resistor 305 increases beyond a preset value, then the current from diode laser power supply 307 is shunted through FET transistor 309, thus insuring that damage to adjacent diode lasers and/or other components is avoided. In alternate embodiments, CMOS devices, BiCMOS devices, BJT devices, relays, or other means are used to automatically divert the current away from diode laser 303.

It will be appreciated that there are numerous ways to implement the invention and that the embodiment illustrated in FIG. 3 is only one, preferred implementation. Similarly, it should be understood that the invention can be integrated within either the diode laser or the diode laser package. Alternately, the invention can be externally mounted relative to the diode laser package. Alternately, the invention can use a combination of mounting techniques, for example bonding the power FETs directly to a cooler plate associated with a diode laser array while mounting the control circuitry to the array package.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. An electrical isolation system comprising:
a diode laser;
a resistor in series with said diode laser;
a power supply coupled to said diode laser;
a power supply controller coupled to said power supply;
means for monitoring a voltage across said resistor;
means for comparing said voltage with a preset value;

means for transmitting a signal when said voltage exceeds said preset value; and means for activating said power supply controller in response to said signal transmitted by said transmitting means.

2. The electrical isolation system of claim 1, wherein said diode laser is located within a diode laser stack.

3. The electrical isolation system of claim 1, wherein said diode laser is located within a diode laser array.

4. The electrical isolation system of claim 1, wherein said power supply controller further comprises means for shunting current away from said diode laser.

5. The electrical isolation system of claim 4, wherein said shunting means further comprises at least one power transistor.

6. The electrical isolation system of claim 1, wherein said activating means operates automatically in response to said signal transmitted by said transmitting means.

7. A method of electrically isolating a laser diode, the method comprising the steps of:

monitoring a voltage across a resistor in series with said laser diode;

automatically transmitting a trigger signal to a power supply controller when said voltage exceeds a preset voltage; and altering at least one electrical characteristic of a circuit coupling power to the laser diode in response to said trigger signal, wherein said altering step is performed by said power supply controller.

8. A method of electrically isolating a laser diode, the method comprising the steps of:

monitoring for a short circuit condition corresponding to said laser diode;

automatically transmitting a trigger signal to a power supply controller when said short circuit condition is detected; and altering at least one electrical characteristic of a circuit coupling power to the laser diode in response to said trigger signal, wherein said altering step is performed by said power supply controller, and wherein said altering step further comprises the step of redirecting current from said laser diode to at least one power transistor.

9. The method of claim 8, wherein said monitoring step further comprises the step of monitoring a voltage across said laser diode, and wherein said automatic transmitting step is performed when said voltage drops below a preset voltage.

10. A method of electrically isolating a laser diode, the method comprising the steps of:

monitoring for an open circuit condition corresponding to said laser diode;

automatically transmitting a trigger signal to a power supply controller when said open circuit condition is detected; and altering at least one electrical characteristic of a circuit coupling power to the laser diode in response to said trigger signal, wherein said altering step is performed by said power supply controller, and wherein said altering step further comprises the step of redirecting current from said laser diode to at least one power transistor.

* * * * *